(12) United States Patent
Makino et al.

(10) Patent No.: US 6,522,016 B1
(45) Date of Patent: Feb. 18, 2003

(54) INTERCONNECTION STRUCTURE WITH FILM TO INCREASE ADHESION OF THE BUMP

(75) Inventors: Yutaka Makino, Kawasaki (JP); Toshiharu Egami, Kawasaki (JP); Eiji Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/531,682

(22) Filed: Mar. 20, 2000

(30) Foreign Application Priority Data

Jul. 2, 1999 (JP) .......................................... 11-189280

(51) Int. Cl.[7] .............................................. H01L 23/48
(52) U.S. Cl. ......................... 257/778; 257/734; 257/737
(58) Field of Search ................................. 257/737, 738, 257/778, 780, 758; 174/261, 263; 29/25.02, 25.01

(56) References Cited

U.S. PATENT DOCUMENTS

| | | | | |
|---|---|---|---|---|
| 5,844,320 A | * | 12/1998 | Ono et al. ................... | 257/778 |
| 5,877,833 A | * | 3/1999 | Schraivogel et al. ......... | 349/149 |
| 5,889,326 A | * | 3/1999 | Tanaka ......................... | 257/737 |
| 5,936,848 A | * | 8/1999 | Mehr et al. .................. | 361/777 |
| 5,998,861 A | * | 12/1999 | Hiruta ......................... | 257/700 |
| 6,084,300 A | * | 7/2000 | Oka ............................. | 257/730 |

FOREIGN PATENT DOCUMENTS

JP          6-236887          8/1994

* cited by examiner

Primary Examiner—Albert W. Paladini
Assistant Examiner—Loudes Cruz
(74) Attorney, Agent, or Firm—Armstrong, Westerman & Hattori, LLP

(57) ABSTRACT

A semiconductor device having a highly resistant metal film and a method of producing such a semiconductor device, which includes a metal film formed on an electrode pad, and a protection film formed in an area where he metal film does not exist. The metal film has a greater thickness on its peripheral end portion in contact with the protection film. The semiconductor device can be produced by a semiconductor production method including the steps of activating the surface o the electrode pad with a chelating solution containing glycine and a compound having a metallic element as nuclei, and forming a metal film by electroless metal plating.

7 Claims, 7 Drawing Sheets

FIG. 3

```
ETCHING      S 1 0
   ↓
WASHING      S 2 0
   ↓
ACTIVATING   S 3 0
   ↓
WASHING      S 4 0
   ↓
ELECTROLESS Ni
PLATING      S 5 0
   ↓
WASHING      S 6 0
   ↓
DRYING       S 7 0
```

FIG. 4

| ACTIVATION SOLUTION OF THE PRESENT INVENTION | ACTIVATION SOLUTION OF THE PRIOR ART |
|---|---|
| $PdCl_2$  0.6 mmol/ℓ (0.1g/ℓ)<br>GLYCINE  0.1 mmol/ℓ<br>KOH  AMOUNT FOR $pH_{12}$<br>WATER  SUITABLE AMOUNT | $PdCl_2$  0.6 mmol/ℓ (0.1g/ℓ)<br>$NH_3$  2.4 mmol/ℓ<br>KOH  AMOUNT FOR $pH_{12}$<br>WATER  SUITABLE AMOUNT |

FIG. 5

| Ni PLATING SOLUTION | |
|---|---|
| NICKEL SULFATE | 10 g/ℓ |
| POTASSIUM CITRATE | 20 g/ℓ |
| SODIUM HYPOPHOSPHITE | 25 g/ℓ |
| WATER | SUITABLE AMOUNT |
| pH | 5.0 |
| TEMPERATURE | 85 °C |

F I G. 7

| SAMPLE | | | PRIOR ART | PRESENT INVENTION |
|---|---|---|---|---|
| | Al OPENING DIAMETER | | 90 μm | |
| | Ni PLATED FILM THICKNESS | | ABOUT 2 μm | ABOUT 2 μm (ABOUT 3 μm ON THE PERIPHERAL END PORTION |
| | SOLDER BUMP COMPOSITION | | Sn/Ag=97/3 | |
| SAMPLE HEATING CONDITIONS | | | 220°C OR HIGHER 4 MINUTES | peak 300°C |
| SHEARING CONDITIONS | HEIGHT | | 10 μm | |
| | SPEED | | 30 μm/s | |
| SHEARING REMOVAL OBSERVATION (Ni−Al REMOVAL OCCURRENCE) | HEATING TIMES | 0 | 0/10 bump | 0/10 bump |
| | | 1 | 0/10 bump | 0/10 bump |
| | | 2 | 0/10 bump | 0/10 bump |
| | | 3 | 3/10 bump | 0/10 bump |
| | | 4 | 8/10 bump | 0/10 bump |
| | | 5 | 10/10 bump | 6/10 bump |

INTERCONNECTION STRUCTURE WITH FILM TO INCREASE ADHESION OF THE BUMP

BACKGROUND OF THE INVENTION

1. Field of the Invention

The present invention generally relates to semiconductor devices, and, more particularly, to a semiconductor device provided with a durable metal film formed on an electrode pad. The present invention also relates to a method of producing such a semiconductor device.

2. Description of the Related Art

Conventionally, a semiconductor device has a metal film called a barrier metal layer formed on an electrode pad. Such a barrier metal layer may be formed by electroless metal plating. For instance, FIG. 1A is an enlarged schematic view of a part including a barrier metal layer of a conventional semiconductor device. A semiconductor device 100 has an electrode pad 103 on a chip 101 made mainly of silicon. A barrier metal layer 105 is disposed on the electrode pad 103. A passivation film 106 serving as a protection film is further disposed in an area where the barrier metal layer 105 does not exist.

As shown in FIG. 1A, the peripheral end portion 105A of the barrier metal layer 105 is in contact with the passivation film 106. Here, the peripheral end portion 105A has substantially the same thickness as the passivation film 106. Also, the barrier metal layer 105 is entirely flat.

FIG. 1B is an enlarged schematic view of a part including a barrier metal layer of another conventional semiconductor device 200. In FIG. 1B, the same components as in FIG. 1A are denoted by the same reference numerals. The barrier metal layer of FIG. 1B is slightly thickener than the barrier metal layer of FIG. 1A. Accordingly, the semiconductor device 200 differs from the semiconductor device 100 in having a slightly thicker barrier metal layer 115 and its peripheral end portion 115A. In FIG. 1B, the peripheral end portion 115A covers an end portion of the passivation film 106. However, the rest of the barrier metal layer 115 has a uniform thickness and an entirely flat shape.

The semiconductor devices 100 and 200 both have a solder bump 107 on the respective barrier metal layers 105 and 115 to be attached to external electrodes.

As described above, the semiconductor devices 100 and 200 are connected to external electrodes via solder bumps. Conventional solder bumps are made mainly of lead. In recent years, however, solder bumps made mainly of tin are preferred in consideration of the environment.

However, when solder bumps made of tin as a main component and silver are used, the strength of the peripheral end portions 105A and 115A in contact with the solder bump 107 decreases, thereby causing incomplete bonding. Because of such incomplete bonding, there is a risk of the electrode pad 103 and the solder bump 107 being brought into contact with each other and nullifying the function of the barrier metal layer 105. Also, there is another problem that the solder bump 107 and the barrier metal layer 105 might become separated from the electrode pad 103.

SUMMARY OF THE INVENTION

A general object of the present invention is to provide semiconductor devices in which the above disadvantages are eliminated.

A more specific object of the present invention is to provide a semiconductor device having a highly resistant metal film formed on an electrode pad, and a method of producing such a semiconductor device.

The reasons of the above problems are not known in detail. However, it is assumed that digestion and diffusion of a metallic element constituting a solder bump progresses preferentially at the peripheral end portion of a metal film. The inventors of the present invention have studied the above problems, and have discovered that the metal film should have a certain shape to reduce the occurrence of the problems.

The objects of the present invention are achieved by a semiconductor device comprising: an electrode pad; a metal film formed on the electrode pad; a protection film formed in an area where the metal film does not exist; and a bump disposed on the metal film. The metal film has a greater thickness at its peripheral end portion which is in contact with the protection film.

As the result of intensive studies made by the inventors, it was found that, even if the solder bump contains a component having digestion and diffusion properties, the thicker peripheral end portion of the metal film in contact with the protection film can improve the durability of the metal film. In the semiconductor device of the present invention, the peripheral end portion of the metal film is thicker than the flat portion of the metal film. When bonding the semiconductor to an external terminal via solder bumps, the peripheral end portion can presumably disperse the diffusive element, thereby improving the durability of the metal film.

The peripheral end portion of the metal film may be 1.3 to 2 times thicker than the flat portion of the metal film.

The metal film of the semiconductor device of the present invention may have a peripheral end portion covering the inner peripheral end portion of the protection film.

The objects of the present invention are also achieved by a semiconductor device production method including the steps of activating the surface of the electrode pad with a chelating solution containing glycine and a compound having a metallic element as nuclei, and forming a metal film by electroless metal plating.

By activating the surface of the electrode pad, the metallic element is precipitated on the surface of the electrode pad, which is a suitable condition for metal plating. Electroless metal plating is then performed on the surface of the electrode pad to form a metal film with the metallic element as nuclei. The peripheral end portion of the metal film in contact with the protection film is thicker than the central portion of the metal film.

The above and other objects and features of the present invention will become more apparent from the following description taken in conjunction with the accompanying drawings.

BRIEF DESCRIPTION OF THE DRAWINGS

FIG. 3 is a flowchart showing a process of forming a metal film on an electrode pad when producing a semiconductor device of the present invention;

FIG. 4 shows an example activating solution used for a semiconductor device of the present invention;

FIG. 5 shows an example nickel plating solution used for a semiconductor device of the present invention;

FIG. 7 shows results of comparison tests of removal resistance between a semiconductor device of the prior art and a semiconductor device of the present invention.

DESCRIPTION OF THE PREFERRED EMBODIMENTS

The following is a description of embodiments of the present invention, with reference to the accompanying drawings.

Figure 2A:
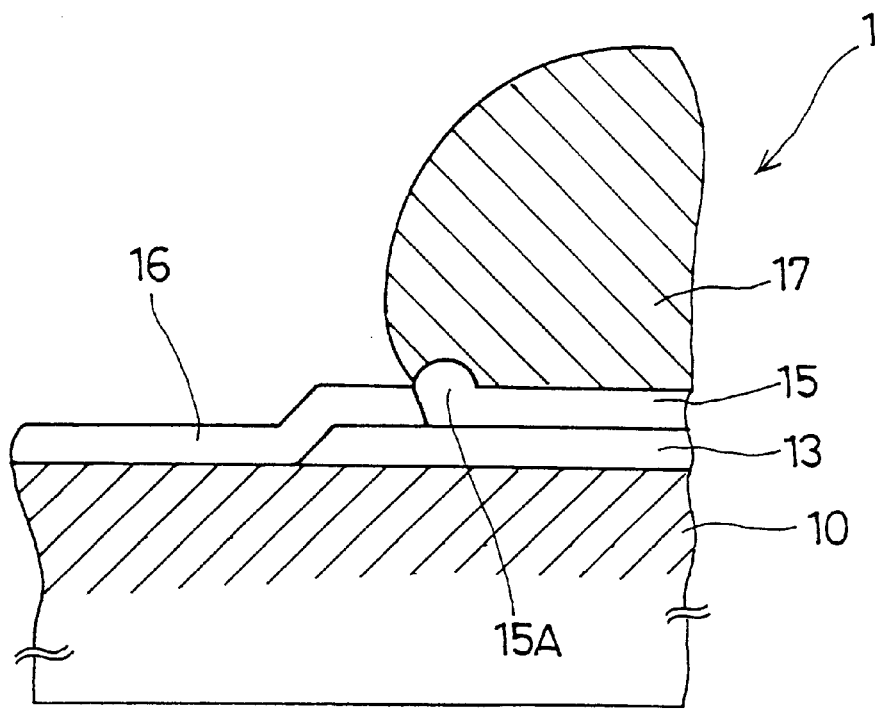
FIG. 2A is an enlarged view of a part of a semiconductor device of one embodiment of the present invention.
Figure 2B:
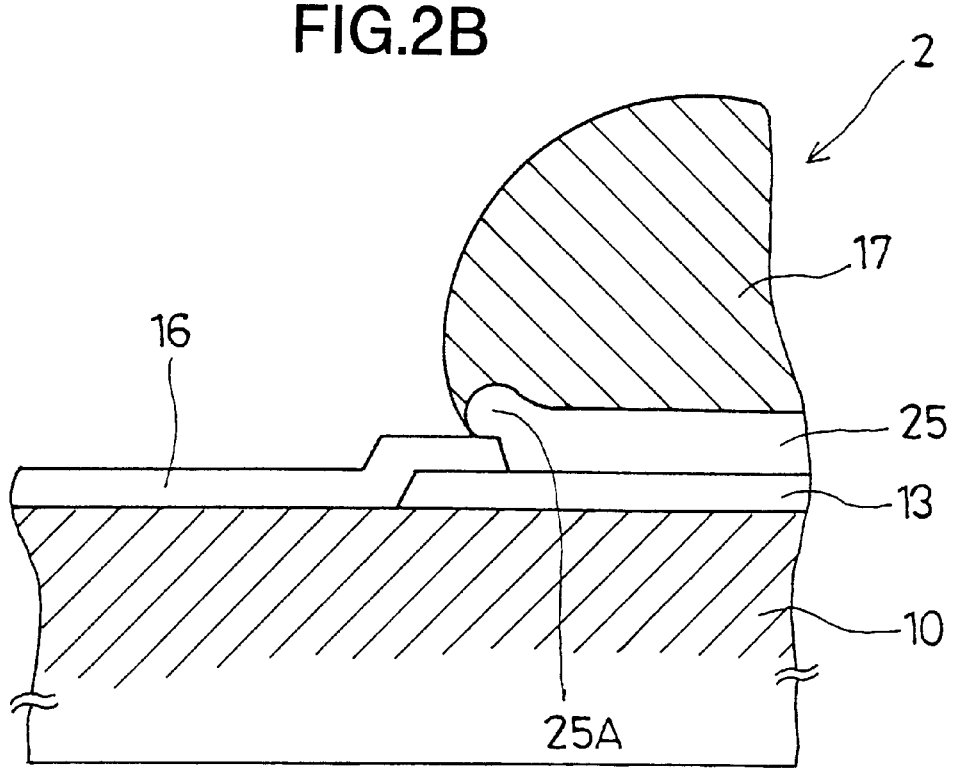
FIG. 2B is an enlarged view of a part of a semiconductor device of another embodiment of the present invention.

FIG. 2A is an enlarged view of a part including a metal film of a semiconductor device of one embodiment of the present invention. FIG. 2B is an enlarged view of a part including a thicker metal film of a semiconductor device of another embodiment of the present invention.

As shown in FIG. 2A, a semiconductor device 1 has an electrode pad 13 formed on a chip 10 made mainly of silicon. The electrode pad 13 is made of aluminum, for instance. A barrier metal layer 15 made of metal is disposed on the electrode pad 13. A passivation film 16 as a protection film is disposed in an area where the barrier metal layer 15 does not exist. The barrier metal layer 15 is made of nickel formed by electroless plating. The passivation film 16 is made of silicon oxide, for instance.

The peripheral end portion 15A of the barrier metal layer 15 is in contact with the passivation film 16. The peripheral end portion 15A is thicker than the central portion of the barrier metal layer 15, which is entirely flat. The flat portion has a thickness of about 1 $\mu$m, which is substantially the same as the passivation film 16, while the peripheral end portion 15A is about 2 $\mu$m in thickness, for instance.

A solder bump 17 is disposed on the barrier metal layer 15. The bump 17 contains no lead, but may be made mainly of tin and also containing silver (Sn:Ag=97:3), for instance.

Another semiconductor device 2 shown in FIG. 2B differs from the semiconductor device 1 shown in FIG. 2A in that a barrier metal layer 25 of the semiconductor device 2 is slightly thicker than the barrier metal layer 15, and has a peripheral end portion 25A. In FIG. 2B, the same components as in FIG. 2A are denoted by the same reference numerals.

As shown in FIG. 2B, the peripheral end portion 25A of the barrier metal layer 25 covers the inner peripheral end portion of the passivation film 16. This is the effect of having the thicker barrier metal layer 25, which is achieved by prolonging the time of the electroless plating process. Even with the thicker barrier metal layer 25, the peripheral end portion 25A is thicker than the central portion. The flat central portion of the barrier metal layer 25 has a thickness of about 2 $\mu$m, while the peripheral end portion 25A is about 3 $\mu$m in thickness, for instance.

As described above, the barrier metal layers 15 and 25 have the thicker peripheral end portions 15A and 25A, respectively. Since tin has digestion and diffusion properties, it invades the peripheral end portions 15A and 25A. When this happens, the thick peripheral end portions 15A and 25A cause the tin to diffuse inside them, thereby maintaining the bonding state. Thus, the prior art problem of incomplete connection and removal of a bump and a barrier metal layer from an electrode pad can be effectively avoided.

FIG. 3 is a flowchart of a process of forming the barrier metal layer 15 as a metal film on the electrode pad 13.

In this flowchart, the process is carried out for the semiconductor device 1 having the electrode pad 13 made of aluminum on the chip 10, and the passivation film 16 formed outside the electrode pad 13. In step S10, etching is performed on the aluminum electrode pad 13 of the semiconductor device 1. More specifically, the semiconductor device 1 is immersed in 500 ml/l of sulfuric acid solution at 70° C.

In step S20, the semiconductor device 1 is thoroughly washed.

In step S30, the surface of the electrode pad 13 of the semiconductor device 1 is activated. This is a preparation step for the following step of obtaining the barrier metal layer 15 having the thicker peripheral end portion by electroless metal plating. An activation solution used here is shown in FIG. 4.

Figure 1A:
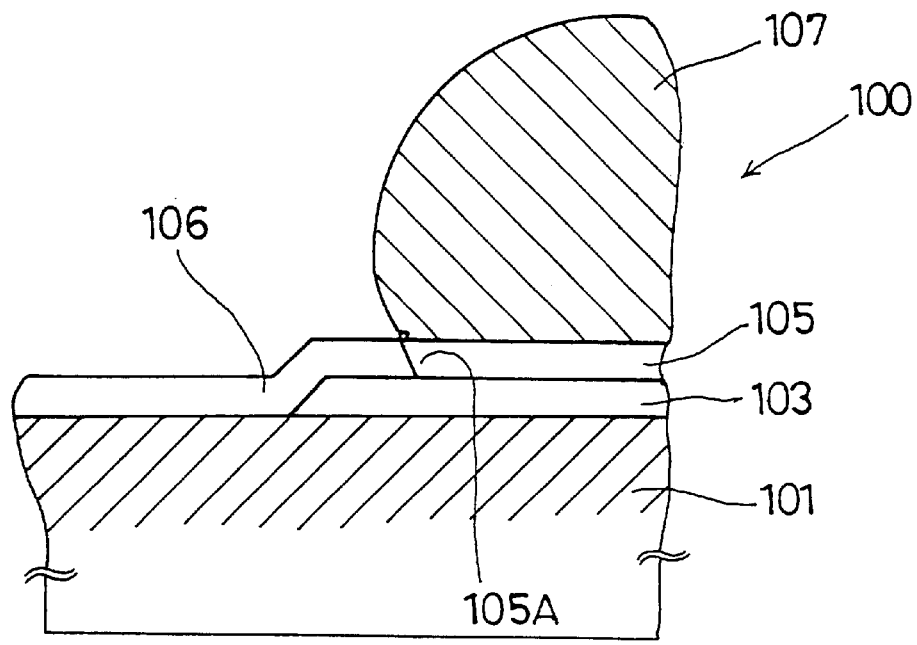
FIG. 1A is an enlarged view of a part including a barrier metal layer of a semiconductor device of the prior art.
Figure 1B:
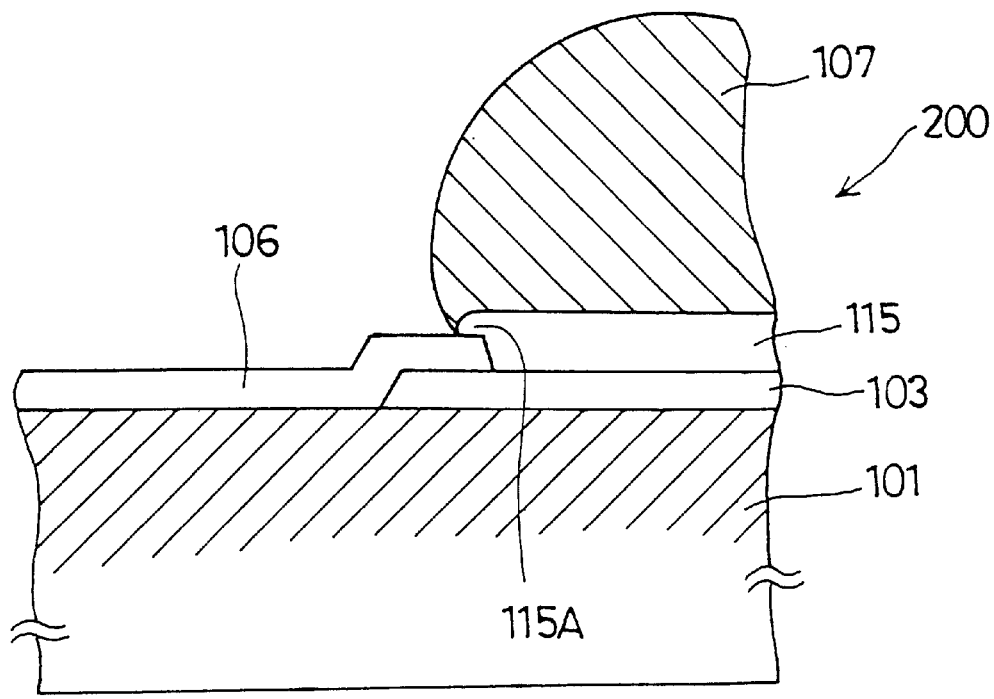
FIG. 1B is an enlarged view of a part including a barrier metal layer of another semiconductor device of the prior art.

The activation solution shown in FIG. 4 is a chelating solution containing 0.6 mmol/l of palladium chloride and 0.1 mol/l of glycine. Palladium serves to coordinate amino groups. In FIG. 4, the activation solution used for producing the conventional semiconductor devices shown in FIGS. 1A and 1B is also shown for reference. The activation solution of the prior art contains ammonia, while the activation solution of the present invention contains glycine.

The Glycine in the solution can restrict homogeneous precipitation of the palladium, so that the palladium can be prevented from being precipitated uniformly from the solution. The glycine serves to precipitate a large amount of palladium on the peripheral end portion of the aluminum electrode pad and an appropriate amount of palladium in the remaining area.

In step S40, the semiconductor device 1 is thoroughly washed.

In step S50, electroless metal plating is performed on the surface of the aluminum electrode pad 13 to form a metal film. Here, the electroless metal plating may be electroless nickel plating, for instance. A nickel plating solution used in the nickel plating is shown in FIG. 5. In the step S50, the surface of the aluminum electrode pad 13 is immersed in the nickel plating solution for about 3 minutes. A nickel metal film having a thickness of about 1 $\mu$m is thus uniformly formed on the surface of the aluminum electrode pad 13, except the peripheral end portion 15A has a thickness of about 2 $\mu$m.

The peripheral end portion 15A is thicker than the rest of the barrier metal layer 15, because a large amount of palladium is precipitated on the peripheral end portion of the aluminum electrode pad 13 in the activation step. The nickel is precipitated with the palladium as nuclei to form the metal film. Accordingly, the barrier metal layer 15, which is a nickel film, has a greater thickness on its peripheral end portion.

In step S60, the semiconductor device 1 is again thoroughly washed. In step S70, the semiconductor device 1 is then dried, and the process of forming the barrier metal layer 15 comes to an end.

It should be understood that the barrier metal layer 15 of the semiconductor device 1 shown in FIG. 2A is formed in the flowchart of FIG. 3. In the case of the semiconductor device 2 having the barrier metal layer 25, which is thicker than the barrier metal layer 15, the time for immersing the aluminum electrode pad 13 in the nickel plating solution should be about 6 minutes to form a nickel metal film having a thickness of about 2 μm uniformly on the surface of the aluminum electrode pad 13 in the step S50. Here, the peripheral end portion 25A covers the inner peripheral end portion of the passivation film 16, having a thickness of about 3 μm.

The bump 17 is placed on the barrier metal layer 15 or 25 of the respective semiconductor device 1 or 2. The bump 17 may be a solder bump made of tin and silver at a ratio of 97:3 (Sn:Ag). After being placed on the barrier metal layer 15 or 25, the solder bump is heated at 270° C. As a result, the solder bump melts and adheres to the entire surface of the barrier metal layer 15 or 25.

Figure 6:
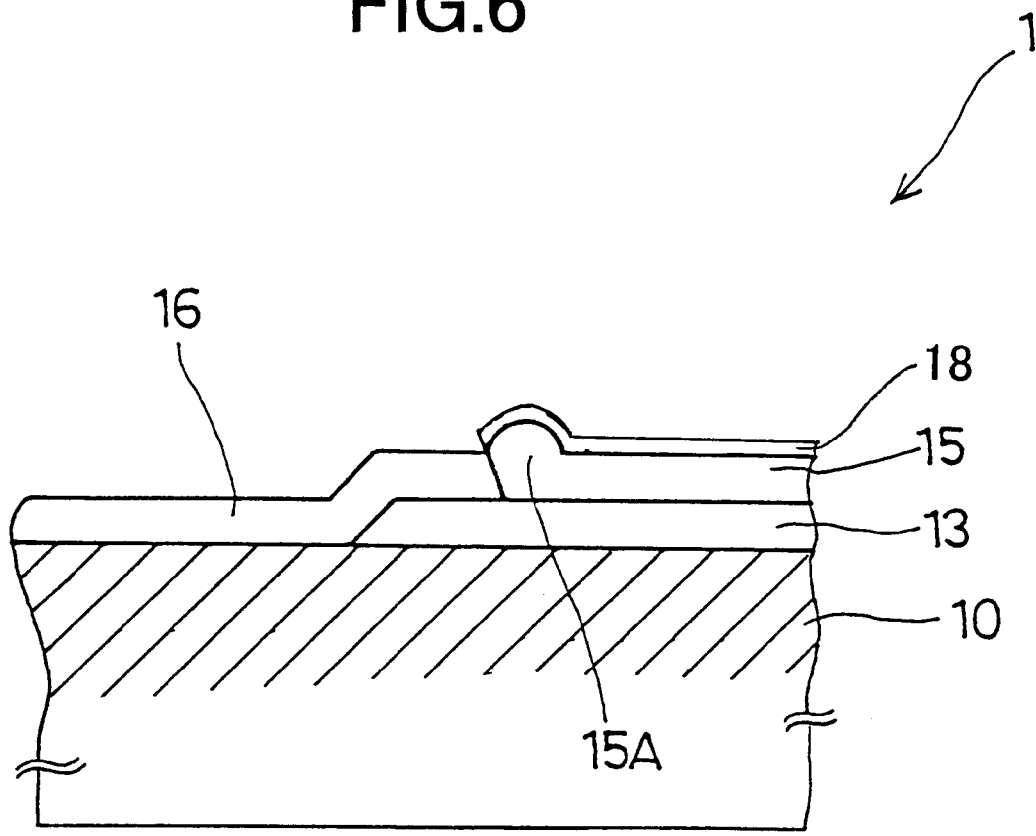
FIG. 6 shows an AU layer formed on a surface of an electrode by electroplating.

It should be understood that a solder bump is not necessarily placed on the barrier metal layer in advance. It is possible to produce a solder bump separately and attach the solder bump to the barrier metal layer when the semiconductor device is bonded to an external electrode. In such a case, the semiconductor device has an oxidation resistant film, such as a gold-plated metal film, placed on the barrier metal layer having the thicker peripheral end portion. As shown in FIG. 6, an Au film 18, for instance, can be formed on the surface of the barrier metal layer 15 by electroplating.

FIG. 7 shows the results of comparison tests of barrier metal layer removal resistance between semiconductor devices of the prior art and semiconductor devices of the present invention. The test conditions are also shown in FIG. 7.

The semiconductor device 200 shown in FIG. 1B was used as the semiconductor device of the prior art, and the semiconductor device 2 shown in FIG. 2B was used as the semiconductor device of the present invention. Accordingly, the central portion of each barrier metal layer formed on the electrode pad was 2 μm in thickness. The semiconductor devices of the present invention each had the peripheral end portion having a thickness of about 3 μm.

A solder bump containing Sn and Ag at a ratio of 97:3 was fixed onto each barrier metal layer, and was subjected to a heating process under the conditions shown in FIG. 7 up to 5 times. A probe was driven 10 μm above the surface of each semiconductor device at 30 μm/s to apply a shearing force to the side surface of the solder bump.

As shown in FIG. 7, 30% of the semiconductor devices of the prior art had detachment of the respective aluminum electrode pads from the barrier metal layers. On the other hand, no detachment or exfoliation occurred on the semiconductor devices of the present invention until the fourth heating process. However, the detachment occurred on 60% of the semiconductor devices in the fifth heating process.

As can be seen from the results, the bond between the electrode pad and the barrier metal layer is stronger in the present invention than in the prior art. Accordingly, the semiconductor devices of the present invention have higher durability.

Figure 8:
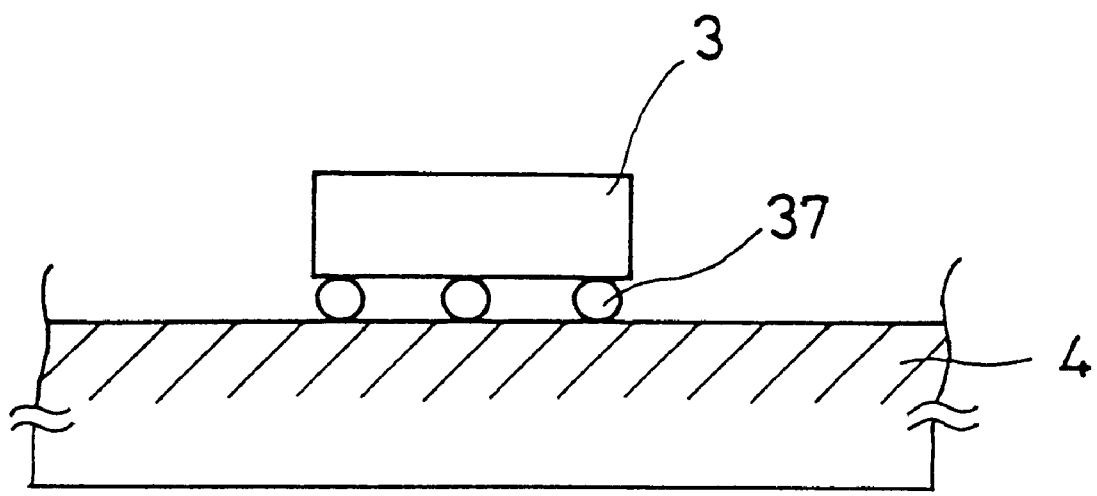
FIG. 8 shows a semiconductor device of the present invention fixed to a substrate via solder bumps.

FIG. 8 shows a semiconductor device of the present invention integrally fixed to a substrate via solder bumps. In this figure, a flip-chip semiconductor device 3 is fixed to a substrate 4 via solder bumps 37.

The present invention is not limited to the specifically disclosed embodiments, but variations and modifications may be made without departing from the scope of the present invention.

The present application is based on Japanese priority application No. 11-189280, filed on Jul. 2, 1999, the entire contents of which are hereby incorporated by reference.

What is claimed is:

1. A semiconductor device comprising:
    a chip;
    an electrode pad formed directly on the chip;
    a metal film pattern formed directly on the electrode pad, the metal film pattern serving as a barrier metal;
    a bump disposed on the metal film pattern;
    wherein the metal film pattern has a greater thickness at a peripheral end portion thereof in order to increase adhesion of the bump and the metal film pattern to the electrode pad.

2. The semiconductor device as claimed in claim 1, further comprising a protection layer formed in an area where the metal film pattern does not exist.

3. The semiconductor device as claimed in claim 1, wherein the bump is a solder bump made mainly of tin.

4. The semiconductor device as claimed in claim 3, wherein the metal film pattern is made of nickel.

5. The semiconductor device as claimed in claim 1, wherein at least the metal film pattern is covered with an oxidation resistant conductive film.

6. A semiconductor device comprising:
    a chip;
    an electrode pad formed directly on the chip;
    a metal film formed directly on the electrode pad; and
    an oxidation resistant conductive film formed on the metal film,
    wherein the metal film has a greater thickness at a peripheral end portion thereof.

7. A semiconductor device comprising:
    a chip;
    an electrode pad formed directly on the chip;
    a metal film formed directly on the electrode pad;
    a protection layer formed in an area where the metal film does not exist; and
    a solder bump for bonding the metal film to a substrate layer,
    wherein the metal film has a greater thickness at a peripheral end portion thereof in contract with the protection layer.

* * * * *